United States Patent
Kim et al.

(10) Patent No.: US 12,189,028 B2
(45) Date of Patent: Jan. 7, 2025

(54) SEMICONDUCTOR DEVICE PERFORMING PROXIMITY SENSING

(71) Applicant: Seoul National University R&DB Foundation, Seoul (KR)

(72) Inventors: Hyunjong Kim, Seoul (KR); Cyuyeol Rhee, Seoul (KR); Suhwan Kim, Seoul (KR)

(73) Assignee: Seoul National University R&DB Foundation, Seoul (KR)

( * ) Notice: Subject to any disclaimer, the term of this patent is extended or adjusted under 35 U.S.C. 154(b) by 319 days.

(21) Appl. No.: 17/717,929

(22) Filed: Apr. 11, 2022

(65) Prior Publication Data
US 2022/0326378 A1 Oct. 13, 2022

(30) Foreign Application Priority Data
Apr. 12, 2021 (KR) .................. 10-2021-0047184

(51) Int. Cl.
*G01S 17/04* (2020.01)
*H03M 1/56* (2006.01)
*H03K 5/24* (2006.01)

(52) U.S. Cl.
CPC ............... *G01S 17/04* (2020.01); *H03M 1/56* (2013.01); *H03K 5/2481* (2013.01)

(58) Field of Classification Search
CPC ......... G01S 17/04; H03M 1/56; H03K 5/2481
See application file for complete search history.

(56) References Cited

U.S. PATENT DOCUMENTS

| | | | |
|---|---|---|---|
| 4,261,659 A * | 4/1981 | Shinoda | G03B 17/20 396/296 |
| 5,553,096 A * | 9/1996 | Messman | H03G 1/0088 375/345 |
| 10,084,468 B1 * | 9/2018 | Boemler | H03M 1/38 |

(Continued)

FOREIGN PATENT DOCUMENTS

| | | |
|---|---|---|
| EP | 3493407 A1 | 6/2019 |
| JP | 2013058909 A | 3/2013 |

(Continued)

OTHER PUBLICATIONS

"Digital Proximity Detector", TSL2671, amsDatasheet, Jul. 12, 2016, pp. 1-44, Austria, Europe.

(Continued)

*Primary Examiner* — Georgia Y Epps
*Assistant Examiner* — Don J Williams
(74) *Attorney, Agent, or Firm* — William Park & Associates Ltd.

(57) ABSTRACT

A semiconductor device includes a signal conversion circuit configured to convert a sensing current provided from a sensing element into a sensing voltage; an analog-to-digital converter (ADC) configured to convert the sensing voltage to a digital value; and a driving circuit configured to drive a light emitting element, wherein the ADC generates a digital value corresponding to proximity to an object by performing a primary operation comparing a ramp signal varying with time and the sensing voltage while the light emitting element is not driven and a secondary operation comparing the ramp signal and the sensing voltage while the light emitting element is driven.

14 Claims, 8 Drawing Sheets

(56) References Cited

U.S. PATENT DOCUMENTS

2017/0299710 A1* 10/2017 Shin .................. G01S 13/86
2018/0227518 A1* 8/2018 Ganguly ............... H04N 25/62

FOREIGN PATENT DOCUMENTS

| KR | 1020150056371 A | 5/2015 |
| KR | 1020160103302 A | 9/2016 |
| KR | 1020170079091 A | 7/2017 |
| KR | 1020180035666 A | 4/2018 |
| KR | 1020180134038 A | 12/2018 |
| KR | 1020190120221 A | 10/2019 |
| KR | 1020200013795 A | 2/2020 |

OTHER PUBLICATIONS

"Proximity and ambient light sensing (ALS) module", STMicroelectronics, VL6180X, Mar. 2016, pp. 1-87.

"SensorStrobe, Ultra Low Power, Time Synchronized, Sensor Data Sampling in the ADuCM3027/ADuCM3029", Analog Devices, AN-1427, 2018, pp. 1-12, One Technology Way, Norwood, MA.

"Light-to-Digital Converter with Proximity Sensing", TSL2771, Mar. 22, 2016, pp. 1-50, ams AG, Austria, Europe.

Cesare Soci, Arthur Zhang, Xin-Yu Bao, Hongkown Kim, Yuhwa Lo, and Deli Wang, "Nanowire Photodetectors," Journal of Nanoscience and Nanotechnology, 2010, pp. 1430-1449, vol. 10, No. 3, American Scientific Publishers.

Christian C. Enz and Gabor C. Temes, "Circuit Techniques for Reducing the Effects of Op-Amp Imperfections: Autozeroing, Correlated Double Sampling, and Chopper Stabilization" in Proceedings of the IEEE, vol. 84, No. 11, pp. 1584-1614, Nov. 1996.

Cyuyeol Rhee, Han Yang, and Suhwan Kim, "A PM1, PM2.5, and PM10 Airborne Particle Detector With Laser Illumination Stabilized by Optical Feedback" IEEE Sensors Journal, vol. 20, No. 4, Feb. 15, 2020.

Cyuyeol Rhee, Junyoung Park, Suhwan Kim, "A 0.3 lx-1.4 Mlx monolithic silicon nanowire light-to-digital converter with temperature-independent offset cancellation," IIEEE Journal of Solid-State Circuits, vol. 55, No. 2, Nov. 2019.

Jimin Cheon and Gunhee Han, "Noise Analysis and Simulation Method for a Single-Slope ADC With CDS in a CMOS Image Sensor" IEEE Trans. Circuits Syst. I, Reg. Papers, vol. 55, No. 10, pp. 2980-2987, Nov. 2008, Republic of Korea.

Michael H. Perrott, et al., "A Temperature-to-Digital Converter for a MEMS-Based Programmable Oscillator With < ±0.5-ppm Frequency Stability and < 1-ps Integrated Jitter", IEEE J. Solid-State Circuits, vol. 48, No. 1, pp. 276-291, Jan. 2013.

Ron Hogervorst et al., "A Compact Power-Efficient 3 V CMOS Rail-to-Rail Input/Output Operational Amplifier for VLSI Cell Libraries" IEEE J. Solid-State Circuits, vol. 29, No. 12, pp. 1505-1513, Dec. 1994.

S. Lee et al., "Ultra-High Responsivity, Silicon Nanowire Photodetectors for Retinal Prosthesis", IEEE Int. Conf. on Micro Electro Mechanical Systems (MEMS), Jan. 29-Feb. 2, 2012, pp. 1364-1367, Paris, France.

Seung-Hoon Ko, "An Automatic Ear Detection Technique in Capacitive Sensing Readout IC Using Cascaded Classifiers and Hovering function" 2019 Symposium on VLSI Circuits Digest of Technical Papers, pp. C218-C219, South Korea.

Siew Li Tan et al., "High-performance silicon nanowire bipolar phototransistors", Applied Physics Letters, vol. 109, No. 3, 2016, AIP Publishing.

Tzu-Yang Lin et al., "A Novel 3D Optical Proximity Sensor Panel and its Readout Circuit" IEEE Sensors 2010 Conference, Nov. 2010, pp. 108-113, Waikoloa, HI, USA.

Ya-Hsiang Tai et al., "Using Amorphous Silicon Gap-Type Thin Film Transistor as Ambient Light Sensors and Proximity Sensors for Smartphones," Sensor phenomena, IEEE Sensors Letters, vol. 3, No. 10, pp. 1-4, Oct. 2019, Art No. 1500304, doi: 10.1109/LSENS.2019.2940763.

Yoshikazu Nitta et al., "High-Speed Digital Double Sampling with Analog CDS on Column Parallel ADC Architecture for Low-Noise Active Pixel Sensor", IEEE Isscc Dig. Tech. Papers, ISSCC 2006, Session 27, Image Sensors, 27.5, Feb. 2006, San Francisco, CA, USA.

\* cited by examiner

SEMICONDUCTOR DEVICE PERFORMING PROXIMITY SENSING

CROSS-REFERENCE TO RELATED APPLICATIONS

The present application claims priority under 35 U.S.C. § 119(a) to Korean Patent Application No. 10-2021-0047184, filed on Apr. 12, 2021, which is incorporated herein by reference in its entirety.

BACKGROUND

1. Technical Field

Various embodiments generally relate to a semiconductor device that performs proximity sensing.

2. Related Art

Recently, an optical proximity sensor that performs proximity sensing in a mobile device has been widely used.

For example, by installing an optical proximity sensor on a smartphone, it can recognize whether a face or an ear is close during a call and prevent incorrect touch input from occurring.

Recently, since the bezel of the smartphone becomes very narrow and the position where the optical proximity sensor can be arranged is decreasing, the optical proximity sensor is installed under the display of the smartphone.

An optical proximity sensor detects proximity by emitting infrared light and detecting infrared light reflected from an object.

In this case, when the sensor is placed under the display, the intensity of infrared light decrease as they pass through the display, so when the emitted infrared light are reflected from an object and reach the sensor, the energy is greatly reduced, making it very difficult to detect.

In order to overcome this problem, the output intensity of infrared light may be increased or the area of the optical sensor may be increased, but there is a problem in that power consumption increases and noise increases.

SUMMARY

In accordance with the present teachings, a semiconductor device may include a bias generating circuit configured to sample a bias voltage according to a reset signal; and a current source configured to provide a bias current according to the bias voltage.

In accordance with the present teachings, a semiconductor device may include a signal conversion circuit configured to convert a sensing current provided from a sensing element into a sensing voltage; an analog-to-digital converter (ADC) configured to convert the sensing voltage to a digital value; and a driving circuit configured to drive a light emitting element, wherein the ADC generates a digital value corresponding to proximity to an object by performing a primary operation comparing a ramp signal varying with time and the sensing voltage while the light emitting element is not driven and a secondary operation comparing the ramp signal and the sensing voltage while the light emitting element is driven.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

The following detailed description references the accompanying figures in describing embodiments consistent with this disclosure. The examples of the embodiments are provided for illustrative purposes and are not exhaustive. Additional embodiments not explicitly illustrated or described are possible. Further, modifications can be made to presented embodiments within the scope of the present teachings. The detailed description is not meant to limit this disclosure. Rather, the scope of the present disclosure is defined only in accordance with the presented claims and equivalents thereof.

Figure 1:
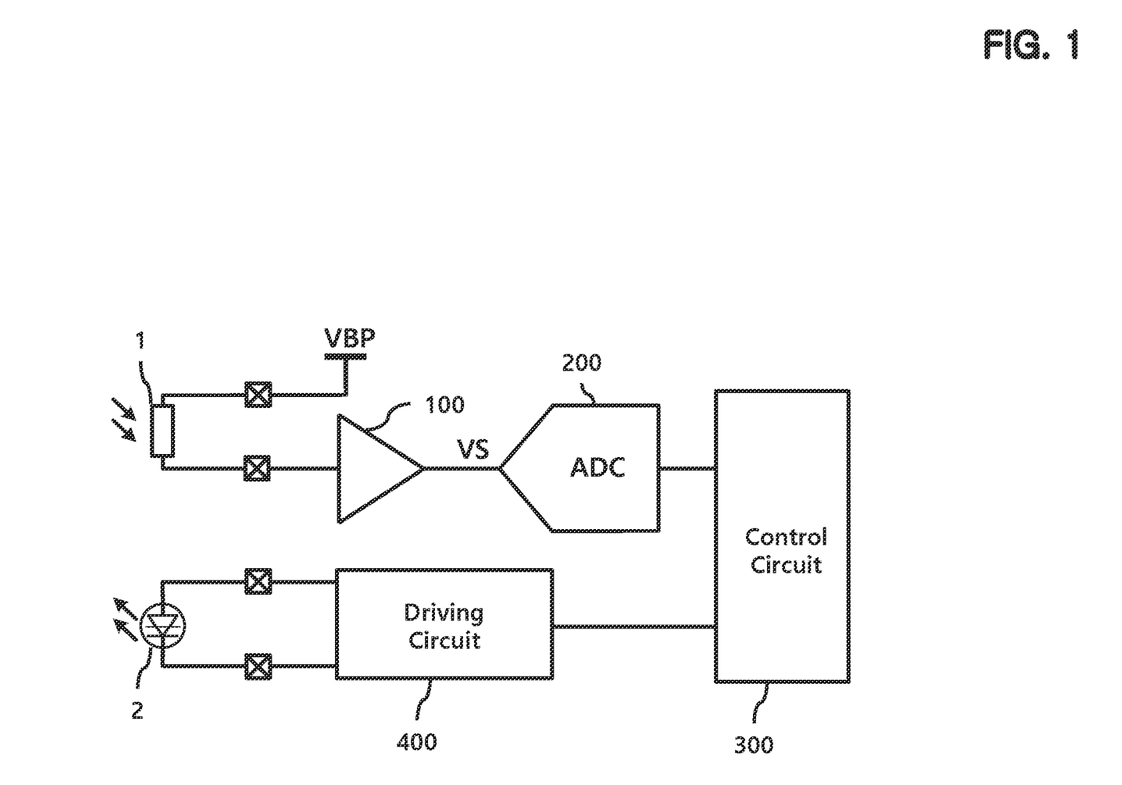
FIG. 1 shows a block diagram of a semiconductor device according to an embodiment of the present disclosure.

FIG. 1 shows a block diagram of a semiconductor device according to an embodiment of the present disclosure.

The semiconductor device includes a signal conversion circuit 100, an analog-to-digital converter (ADC) 200, a control circuit 300, and a driving circuit 400.

The semiconductor device may be coupled to a sensing element 1 and a light emitting element 2.

The sensing element 1 is, for example, a silicon nanowire material, and when light emitted from the light emitting element 2 is reflected from an object, the sensing element 1 detects the reflected light and converts it into a sensing current.

A bias voltage VBP is provided to one terminal of the sensing element 1, and the other terminal is coupled to the signal conversion circuit 100.

The light emitting element 2 is, for example, a Vertical-Cavity Surface Emitting Laser (VCSEL) and emits light under the control of the driving circuit 400.

The signal conversion circuit 100 converts the sensing current output from the sensing element 1 into a voltage to output a sensing voltage VS.

The ADC 200 converts the sensing voltage VS into a digital value.

In the present embodiment, the ADC 200 is a single-slope type and generates a digital value using a correlated double sampling (CDS) technique for noise reduction.

That is, a primary digital value is generated in a state in which light is not emitted from the light emitting element 2, a secondary digital value is generated in a state in which light is emitted from the light emitting element 2, and a final digital value is determined by using difference between the primary digital value and the secondary digital value.

The configuration of the ADC 200 will be described in detail again below.

The control circuit 300 controls the ADC 300 and the driving circuit 400 for light sensing. The control circuit 300 may perform additional digital signal processing using the digital value output from the ADC 200.

Figure 2:
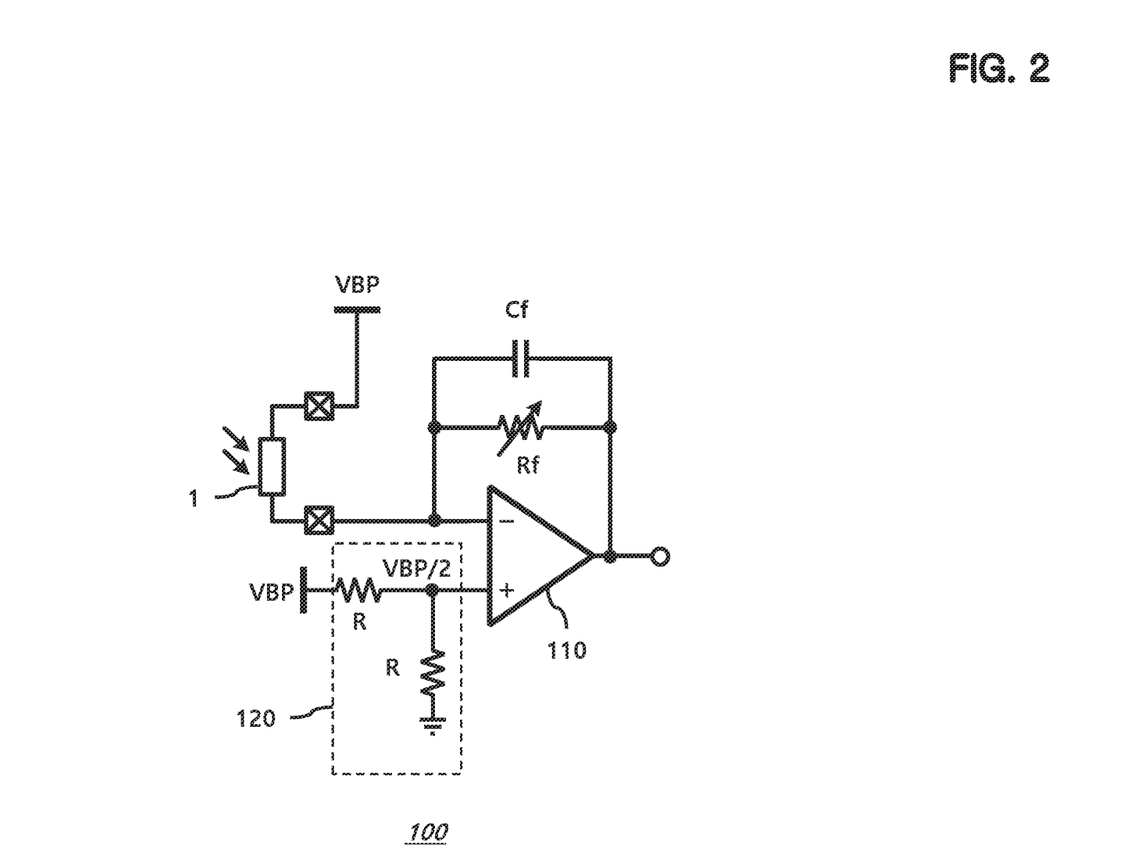
FIG. 2 shows a circuit diagram of a signal conversion circuit according to an embodiment of the present disclosure.

FIG. 2 is a circuit diagram illustrating a signal conversion circuit 100 according to an embodiment of the present disclosure.

In the present embodiment, the signal conversion circuit 100 has the form of a transimpedance amplifier, but is not limited thereto.

The signal conversion circuit 100 includes an operational amplifier 110.

The positive input terminal of the operational amplifier 110 is biased to 0.5 VBP by the bias circuit 120.

The bias circuit 120 includes two bias resistors R connected in series between a bias voltage VBP and a ground voltage.

A sensing current is applied to the negative input terminal of the operational amplifier 110 being connected to the sensing element 1.

A feedback resistor Rf and a feedback capacitor Cf are connected in parallel between the negative input terminal and the output terminal of the operational amplifier 110.

Even when the light emitting element 2 does not emit light, a sensing current is generated in the sensing element 1, which is referred to as a dark current Id.

In this case, the sensing voltage VS is expressed as Equation 1.

$$VS = \frac{VBP}{2} - Id \times Rf \qquad \text{[Equation 1]}$$

When light is emitted from the light emitting element 2, a signal current Iprox is generated along with a dark current in the sensing element 1. In this case, the sensing voltage VS is expressed as Equation 2.

$$VS = \frac{VBP}{2} - (Id + Iprox) \times Rf \qquad \text{[Equation 2]}$$

The sum of the dark current and the signal current may be referred to as a sensing current, and the sensing voltage corresponds to the sensing current.

In order to ensure maximum swing of a signal, the value of the feedback resistor Rf may be adjusted so that the sensing voltage VS approaches 0.5 VBP when the signal current is 0, and the sensing voltage VS approaches 0V when the signal current is maximum.

Figure 3:
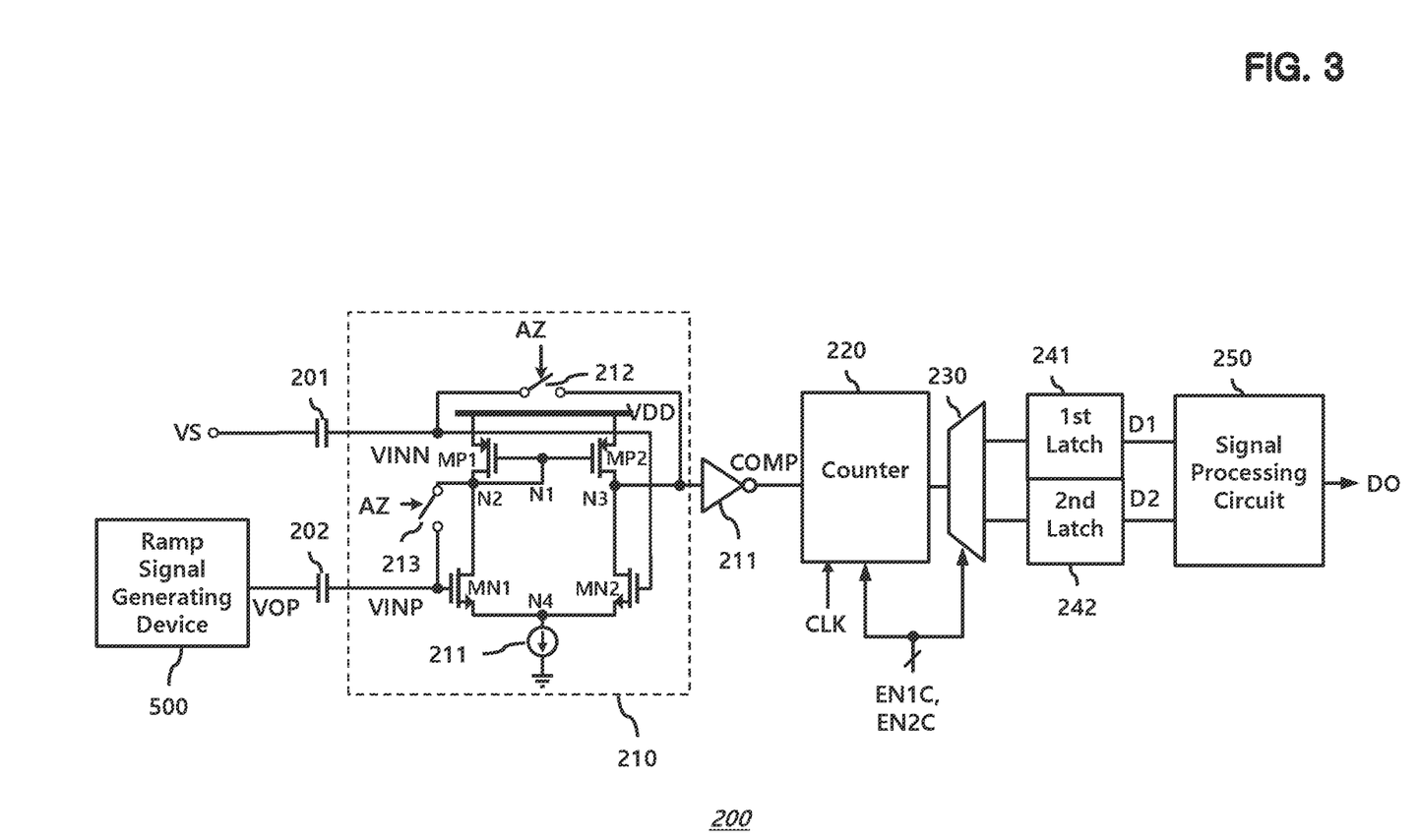
FIG. 3 shows a block diagram of an analog-to-digital converter according to an embodiment of the present disclosure.

FIG. 3 shows a block diagram of an ADC 200 according to an embodiment of the present disclosure.

In this embodiment, the ADC 200 uses a single slope method and generates a final digital value using the CDS method.

The ADC 200 includes the ramp signal generating device 500, a comparator 210, a counter 220, a selection circuit 230, a first latch 241, a second latch 242, and a signal processing circuit 250.

The ramp signal generating device 500 generates a ramp signal VOP that monotonically decreases or monotonically increases according to time.

The comparator 210 compares the ramp signal VOP and the sensing voltage VS to output a comparison signal COMP.

In the present embodiment, the ramp signal VOP is a monotonically decreasing signal from the initial high voltage, and the comparator 210 outputs a low-level signal when the sensing voltage VS becomes greater than the ramp signal VOP.

In this embodiment, the ADC 200 further includes an inverter 211 that inverts the output of the comparator 210 to output the comparison signal COMP.

The counter 220 performs two operations according to the clock signal CLK for the CDS operation.

The selection circuit 230 provides the output of the counter 220 to the first latch 241 in the primary operation, and the first latch 241 stores the output value of the counter 220 as a first digital value D1 when the comparison signal COMP is activated.

The selection circuit 230 provides the output of the counter 220 to the second latch 242 in the secondary operation, and the second latch 242 stores the output value of the counter 220 as a second digital value D2 when the comparison signal COMP is activated.

In FIG. 3, the first counter control signal EN1C controls the primary operation, and the second counter control signal EN2C controls the secondary operation.

The ADC 200 may further include a coupling capacitor 201 that provides the sensing voltage VS to a negative input terminal of the comparator 210 and a coupling capacitor 202 that provides the ramp signal VOP to a positive input terminal of the comparator 210.

A voltage applied to the positive input terminal of the comparator 210 is denoted as a first input voltage VINP, and a voltage applied to the negative input terminal of the comparator 210 is denoted as a second input voltage VINN.

The comparator 210 is a differential amplifier and includes PMOS transistors MP1 and MP2 having gates commonly coupled to the first node N1.

The source and drain of the PMOS transistor MP1 are coupled between the power supply voltage VDD and the second node N2, and the source and the drain of the PMOS transistor MP2 are coupled between the power supply voltage VDD and the third node N3.

The first node N1 and the second node N2 are commonly coupled, and the third node N3 is coupled to the output terminal of the comparator 210.

The comparator 210 includes an NMOS transistor MN1 having a gate coupled to the positive input terminal and an NMOS transistor MN2 having a gate coupled to the negative input terminal.

The drain and source of the NMOS transistor MN1 are coupled between the second node N2 and the fourth node N4, and the drain and the source of the NMOS transistor MN2 are coupled between the third node N3 and the fourth node N4.

The comparator 210 includes a current source 211 coupled between the fourth node N4 and a ground voltage.

The comparator 210 includes a switch 212 coupling the negative input terminal and the output terminal N3 according to an auto-zero signal AZ and a switch 213 coupling the second node N2 and the positive input terminal according to the auto-zero signal AZ.

When the auto-zero signal AZ is activated, the first input voltage VINP applied to the positive input terminal and the second input voltage VINN applied to the negative input terminal are set as the common voltage VCOMP.

Accordingly, low-frequency noise and DC offset of the comparator 210 may be removed.

Figure 4:
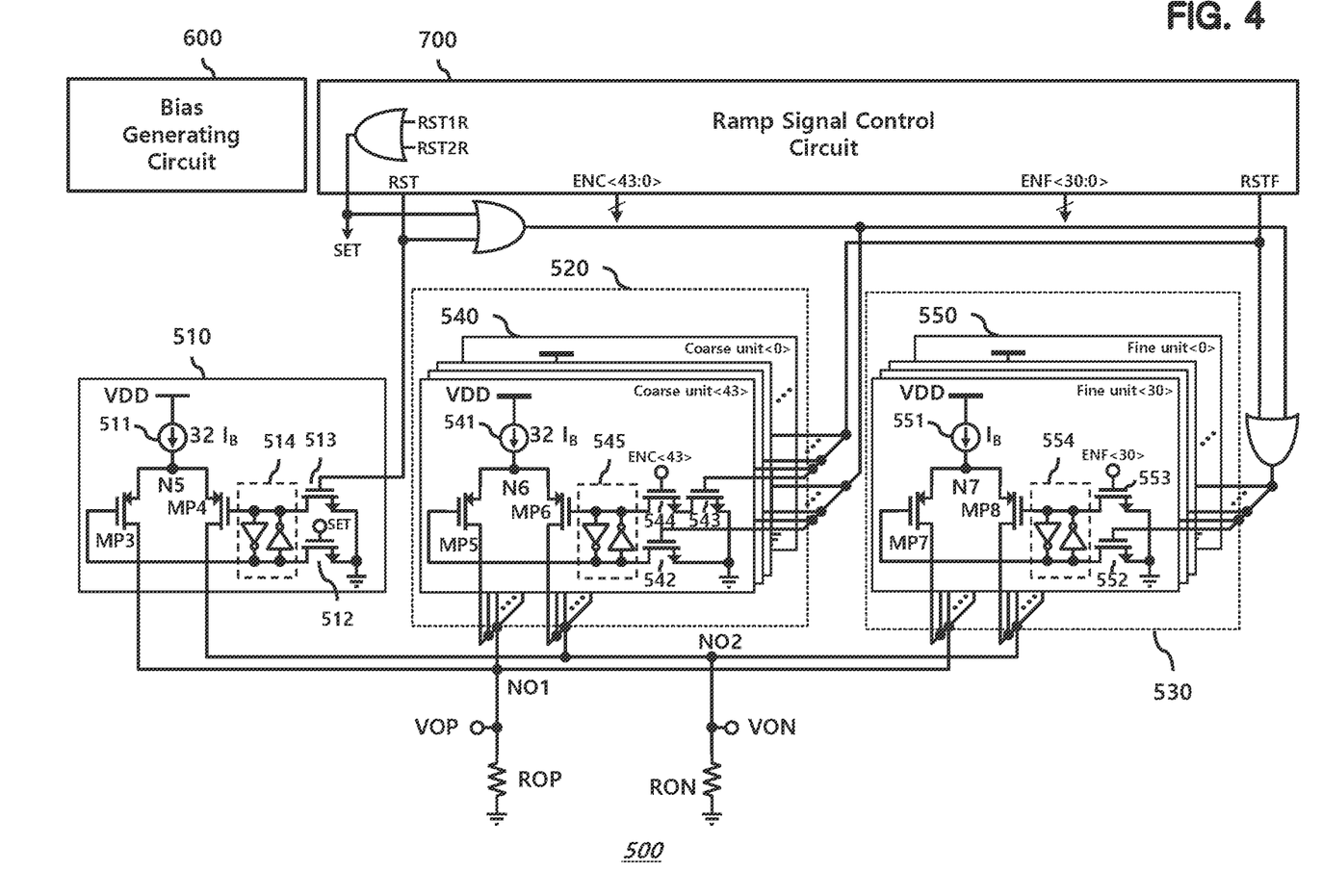
FIGS. 4 and 5 show circuit diagrams of a ramp signal generating device according to an embodiment of the present disclosure.

FIG. 4 shows a circuit diagram of a ramp signal generating device 500.

The ramp signal generating device 500 includes an initial current circuit 510, a first current control circuit 520, a second current control circuit 530, a bias generating circuit 600, and a ramp signal control circuit 700.

The initial current circuit 510 includes a first current source 511 coupled between the power supply voltage VDD and a fifth node N5, and a PMOS transistor MP3 coupled between the fifth node N5 and a first output node NO1, and a PMOS transistor MP4 coupled between the fifth node N5 and the second output node NO2.

In this embodiment, the magnitude of the bias current provided by the first current source 511 is 32 $I_B$.

The gate of the PMOS transistor MP3 is coupled to the ground voltage through a switch 512 controlled by a set signal SET.

A gate of the PMOS transistor MP4 is coupled to a ground voltage through a switch 513 controlled by a reset signal RST.

The initial current circuit 510 further includes a latch 514 coupled between the gate of the PMOS transistor MP3 and the gate of the PMOS transistor MP4, so that one of the two PMOS transistors MP3 and MP4 is turned off and the other one is turned on.

The first output resistor ROP is coupled between the first output node NO1 and the ground voltage, and the ramp signal VOP is output from the first output node NO1.

The first output resistance ROP may be referred to as an output resistor, and a current flowing through the first output resistor ROP may be referred to as an output current.

A second output resistor RON is coupled between the second output node NO2 and the ground voltage, and a voltage output from the second output node NO2 is denoted as VON.

The reset signal RST is activated once to perform an initial reset operation before an analog-to-digital conversion operation.

The set signal SET is a signal obtained by performing an OR operation on the first reset signal RST1R and the second reset signal RST2R.

The first reset signal RST1R is a signal activated before the primary operation, and the second reset signal RST2R is a signal activated before the secondary operation.

Accordingly, after the reset operation, all currents provided from the first current source 511 flow through the second output node NO2, and after the first reset signal is activated, all currents flow through the first output node NO1.

The first current control circuit 520 includes a plurality of first unit current control circuits 540.

In the present embodiment, the number of the first unit current control circuits 540 is 44.

Each of the plurality of first unit current control circuits 540 is controlled according to a corresponding bit of the multi-bit first current control signal ENC.

All of the plurality of first unit current control circuits 540 have substantially the same configuration.

The first unit current control circuit 540 includes a second current source 541 coupled between the power supply voltage VDD and a sixth node N6, a PMOS transistor MP5 coupled between the sixth node N6 and a first output node NO1, and a PMOS transistor MP6 coupled between the sixth node N6 and the second output node NO2.

In this embodiment, the magnitude of the bias current provided by the second current source 541 is 32 $I_B$.

A gate of the PMOS transistor MP5 is connected to a ground voltage through a switch 542.

The switch 542 is turned on when the set signal SET or the reset signal RST is activated.

A gate of the PMOS transistor MP6 is coupled to a ground voltage through series-connected switches 543 and 544.

The switch 543 is turned on according to the third reset signal RSTF, and the switch 544 is controlled according to a corresponding bit of the first current control signal ENC.

The first unit current control circuit 540 further includes a latch 545 coupled between the gate of the PMOS transistor MP5 and the gate of the PMOS transistor MP6, so that one of the two PMOS transistors MP5 and MP6 is turned off and the other is turned on.

The switch 542 is activated when the set signal SET or the reset signal RST is activated. That is, during the initial reset operation, before the first operation, or before the second operation, the switch 542 is activated so that all currents provided from the second current source 541 are provided through the first output node NO1.

The switch 543 is turned on when the third reset signal RSTF is activated, and the switch 544 is activated when a corresponding bit of the first current control signal ENC is activated.

The third reset signal RSTF is activated when the second current control signal ENF becomes the maximum.

The second current control circuit 530 includes a plurality of second unit current control circuits 550.

In this embodiment, the number of second unit current control circuits 550 is 31.

Each of the plurality of second unit current control circuits 550 is controlled according to a corresponding bit of the multi-bit second current control signal ENF.

All of the plurality of second unit current control circuits 550 have substantially the same configuration.

The second unit current control circuit 550 includes a third current source 551 coupled between the power supply voltage VDD and the seventh node N7, a PMOS transistor MP7 coupled between a seventh node N7 and the first output node NO1, and a PMOS transistor MP8 coupled between the seventh node N7 and the second output node NO2.

In this embodiment, the magnitude of the bias current provided by the third current source 551 is $I_B$.

A gate of the PMOS transistor MP7 is coupled to a ground voltage through a switch 552. The switch 552 is turned on when the set signal SET or the reset signal RST or the third reset signal RSTF is activated.

A gate of the PMOS transistor MP8 is coupled to a ground voltage through a switch 553.

The switch 553 is controlled according to a corresponding bit of the second current control signal ENF.

The second unit current control circuit 550 further includes a latch 554 coupled between a gate of the PMOS transistor MP7 and a gate of the PMOS transistor MP8, and one of the two PMOS transistors MP7 and MP8 is turned off and the other is turned on.

The switch 552 is turned on when the set signal SET or the reset signal RST or the third reset signal RSTF is activated. That is, when the switch 542 is activated at the initial reset operation, before the first operation, before the second operation, or during the third reset operation, all the current provided from the third current source 551 is provided through the first output node NO1.

In order to generate the ramp signal, each of the initial current circuit 510, the first current control circuit 520, and the second current control circuit 530 provides the maximum current to the first output node NO1.

Thereafter, according to the second current control signal ENF, the switch 553 of the second unit current control circuit 550 is sequentially turned on, and the current provided from the second current control circuit 530 to the first output node NO1 decreases sequentially.

When the second current control signal ENF becomes the maximum, the third reset signal RSTF is activated.

Thereafter, the first current control signal ENC increases by one step, and accordingly, the magnitude of the current provided from the first current control circuit 520 to the first output node NO1 decreases by one step.

Thereafter, the second current control signal ENF is initialized and the same operation is repeated.

The first unit current control circuit 540 regulates the current in units of 32 $I_B$ and the second unit current control circuit 550 regulates the current in units of $I_B$, so that the first unit current control circuit 540 may be represented as a coarse unit, the second unit control circuit may be represented as a fine unit 550.

Accordingly, the magnitude of the ramp signal VOP gradually decreases in each of the primary operation and the secondary operation.

When the third reset signal RSTF is turned on, switching occurs in the first current control circuit 520 and in the second current control circuit 530. At this time, a glitch may occur in the ramp signal VOP.

Figure 5:
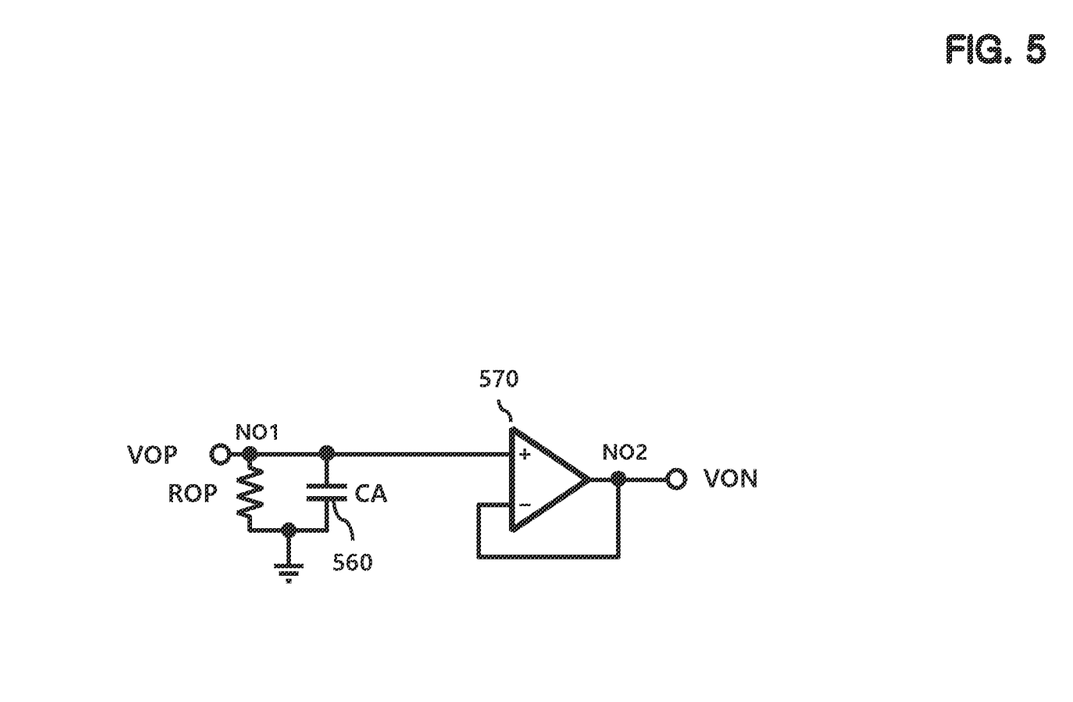

In order to reduce the glitch, an anti-noise capacitor CA coupled in parallel to a first output resistor ROP may be additionally coupled as shown in FIG. 5.

The glitch may be substantially removed by further adding a unit gain amplifier 570 between the first output node NO1 and the second output node NO2.

The bias generating circuit 600 determines the magnitude of current provided by the first current source 511, the second current source 541, and the third current source 551, and may be implemented using a current mirror. This will be disclosed in detail with reference to FIG. 6 below.

The ramp signal control circuit 700 generates a set signal SET, a reset signal RST, a first reset signal RST1R, a second reset signal RST2R, a third reset signal RSTF, and a first current control signal ENC and the second current control signal ENF to generate the ramp signal VOP in the primary operation and the secondary operation.

Although the ramp signal control circuit 700 is illustrated as a part of the ramp signal generating device 500 in FIG. 4, the ramp signal control circuit 700 may be included as a part of the control circuit 300.

Figure 6:
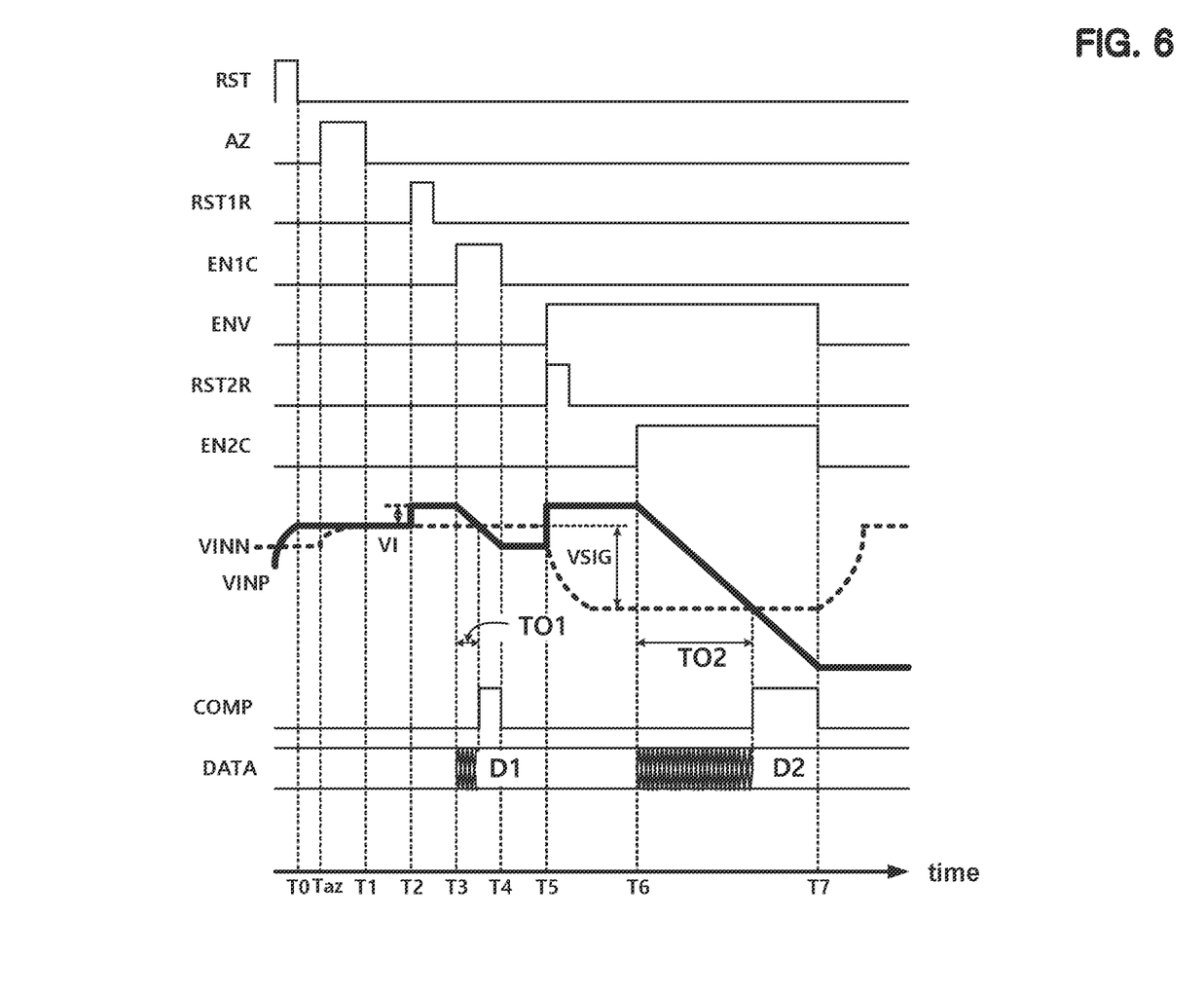
FIG. 6 shows a timing diagram illustrating an operation of a semiconductor device according to an embodiment of the present disclosure.

FIG. 6 shows a timing diagram illustrating an operation of a semiconductor device according to an embodiment of the present disclosure.

The reset signal RST is activated before T0, and accordingly, the first current control circuit 520 and the second current control circuit 530 in the ramp signal generating device 500 provide the maximum current, and at T0, the first input voltage VINP converges to a corresponding voltage.

Thereafter, the auto-zero signal AZ is activated between Taz and T1 to perform an auto-zero operation.

According to the auto-zero operation, the first input voltage VINP and the second input voltage VINN input to the comparator 210 are set as the common voltage VCOMP.

FIG. 6 illustrates that the common voltage VCOMP is the same as the first input voltage VINP immediately after the reset operation, but the two voltages are not necessarily the same.

At T2, the first reset signal RST1R is activated, and accordingly, the set signal SET is activated, so that the current provided from the first current source 511 in the initial current circuit 510 is additionally supplied to the first output node NO1.

Accordingly, the first input voltage VINP increases by the initial voltage VI.

After the first reset signal RST1R is deactivated, the first counter control signal EN1C is activated at T3.

Accordingly, the counter 220 starts a primary operation according to the clock signal CLK.

As described above, during the primary operation, the light emitting element 2 is maintained in an inactive state.

After T3, the ramp signal generating device 500 generates a gradually decreasing ramp signal VOP, and accordingly, a gradually decreasing voltage of the first input voltage VINP is also applied.

When the time interval TO1 elapses, the second input voltage VINN becomes greater than the first input voltage VINP, thereby activating the comparison signal COMP.

Accordingly, the first latch 241 stores the first digital value D1, which is a counter value when TO1 has elapsed from T3.

Assuming that the frequency of the clock signal CLK is Fosc, the first digital value D1 is expressed by Equation 3.

$$D1 = TO1 \times Fosc \quad \text{[Equation 3]}$$

Thereafter, the first counter control signal EN1C is deactivated at T4.

Thereafter, at T5, the second reset signal RST2R is activated, and accordingly, the set signal SET is activated.

Accordingly, the current provided from the first current source 511 in the initial current circuit 510 is additionally supplied to the first output node NO1, and the current supplied from the first current control circuit 520 and the second current control circuit 530 becomes maximum.

At this time, the first input voltage VINP rises to the same level as the voltage at T2.

As the second reset signal RST2R is activated, the light emission control signal ENV is activated to drive the light emitting device 2 through the driving circuit 400.

After the second reset signal RST2R is deactivated, the second counter control signal EN2C is activated at T6.

At this time, the sensing voltage VS output from the signal conversion circuit 100 should be converged to the signal voltage VSIG corresponding to proximity to an object.

The counter 220 starts a secondary operation according to the clock signal CLK.

After T6, the ramp signal generating device 500 generates a gradually decreasing ramp signal VOP, and accordingly, a gradually decreasing voltage of the first input voltage VINP is also applied.

When the time interval of TO2 elapses, the second input voltage VINN becomes greater than the first input voltage VINP, and thereby the comparison signal COMP is activated.

Accordingly, the second latch 242 stores the second digital value D2, which is a counter value when the time interval TO2 from T6 has elapsed.

Assuming that the frequency of the clock signal CLK is Fosc, the second digital value D2 is expressed by Equation 4.

$$D2 = TO2 \times Fosc \quad \text{[Equation 4]}$$

Thereafter, at T7, the second counter control signal EN2C and the light emission control signal ENV are deactivated.

The signal processing circuit 250 of FIG. 3 may output the final digital value DO corresponding to the sensing voltage VS by using the difference between the first digital value D1 and the second digital value D2.

The digital value DO may be expressed by Equation 5.

$$DO = (TO2 - TO1) \times Fosc = VSIG \times \frac{Fosc}{\alpha} \quad \text{[Equation 5]}$$

In Equation 5, a denotes a rate of decrease of the ramp signal. This will be specifically disclosed again with reference to FIG. 8 below.

Figure 7:
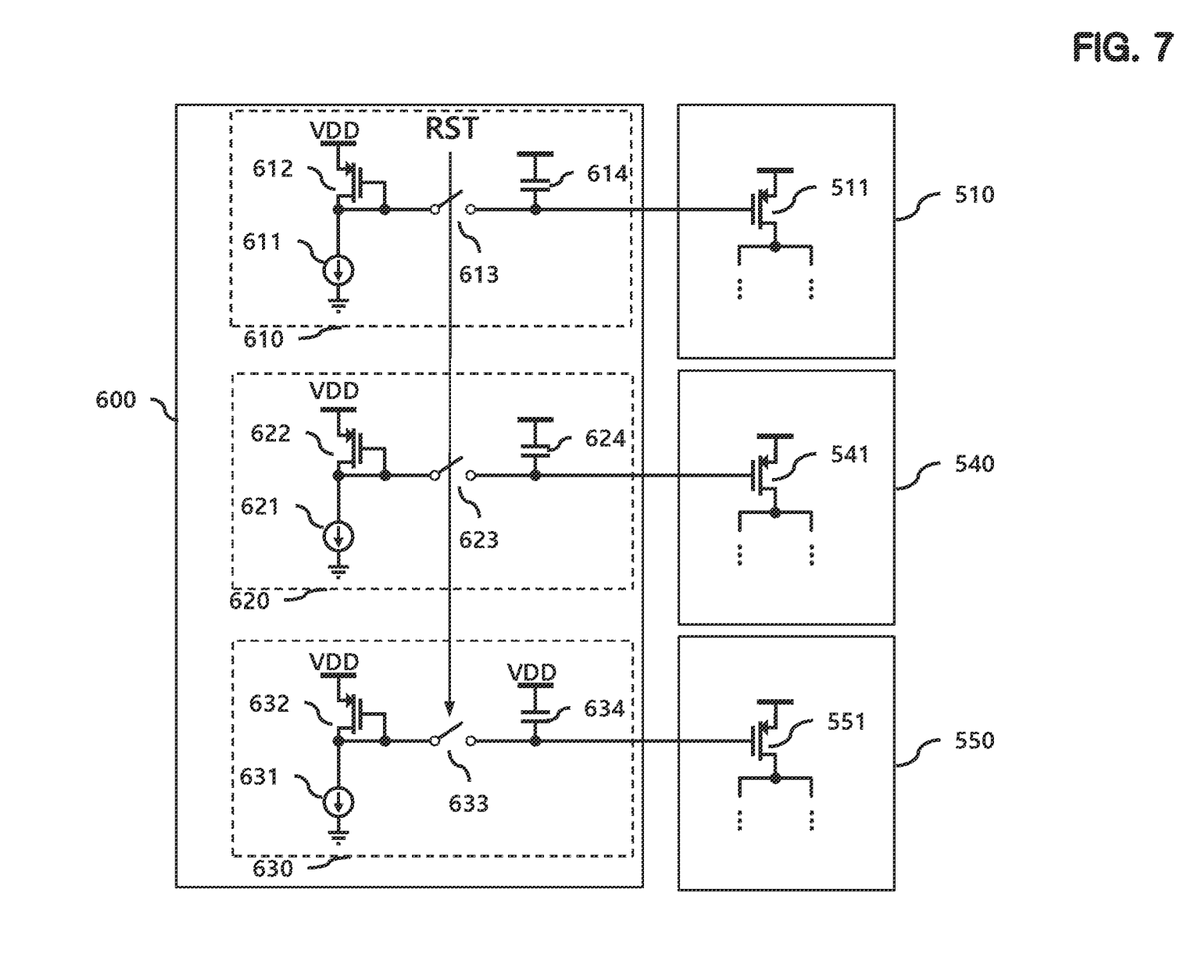
FIG. 7 shows circuit diagram of a bias generating circuit according to an embodiment of the present disclosure.

FIG. 7 is a circuit diagram illustrating a bias generating circuit 600 according to an embodiment of the present disclosure.

The bias generating circuit 600 determines current provided by the first current source 511 of the initial current circuit 510, the second current source 541 of the first unit current control circuit 540, the third current source 551 of the second unit current control circuit 550 through current mirroring.

In FIG. 7, the first current source 511, the second current source 541, and the third current source 551 are represented by PMOS transistors, respectively.

The bias generating circuit 600 includes a first bias generating circuit 610, a second bias generating circuit 620, and a third bias generating circuit 630.

The first bias generating circuit 610 includes a PMOS transistor 612 having a source and a drain coupled between the power supply voltage VDD and a first bias current source 611, and a switch 613 having one terminal coupled to the gate of the PMOS transistor 612, and a bias sampling capacitor 614 coupled between the other terminal of the switch 613 and the power supply voltage VDD.

The gate of the PMOS transistor 612 is coupled to the gate of the PMOS transistor 511.

When the reset signal RST is activated, the switch 613 is turned on to charge the bias sampling capacitor 614 according to the gate voltage of the PMOS transistor 612.

The gate voltage of the PMOS transistor 612 may be subjected to time-varying noise, and accordingly, the current provided from the first current source 511 may also be subject to time-varying noise.

In the present disclosure, noise during the reset operation can be fixed by sampling the gate voltage of the PMOS transistor 612 and providing it to the gate of the PMOS transistor 511.

The second bias generating circuit 620 includes a PMOS transistor 622 having a source and a drain coupled between the power supply voltage VDD and a second bias current source 621, and a switch 623 having one terminal coupled to the gate of the PMOS transistor 622, and a bias sampling capacitor 624 coupled between the other terminal of the switch 623 and the power supply voltage VDD.

The gate of the PMOS transistor 622 is coupled to the gate of the PMOS transistor 541.

The third bias generating circuit 630 includes a PMOS transistor 632 having a source and a drain coupled between the power supply voltage VDD and a third bias current source 631, and a switch 633 having one terminal coupled to the gate of the PMOS transistor 632, and a bias sampling capacitor 634 coupled between the other terminal of the switch 633 and the power supply voltage VDD.

The gate of the PMOS transistor 632 is coupled to the gate of the PMOS transistor 551.

The configuration and operation of the second bias generating circuit 620 and the third bias generating circuit 630 are substantially the same as those of the first bias generating circuit 610, and thus a repeated description thereof will be omitted.

Figure 8:
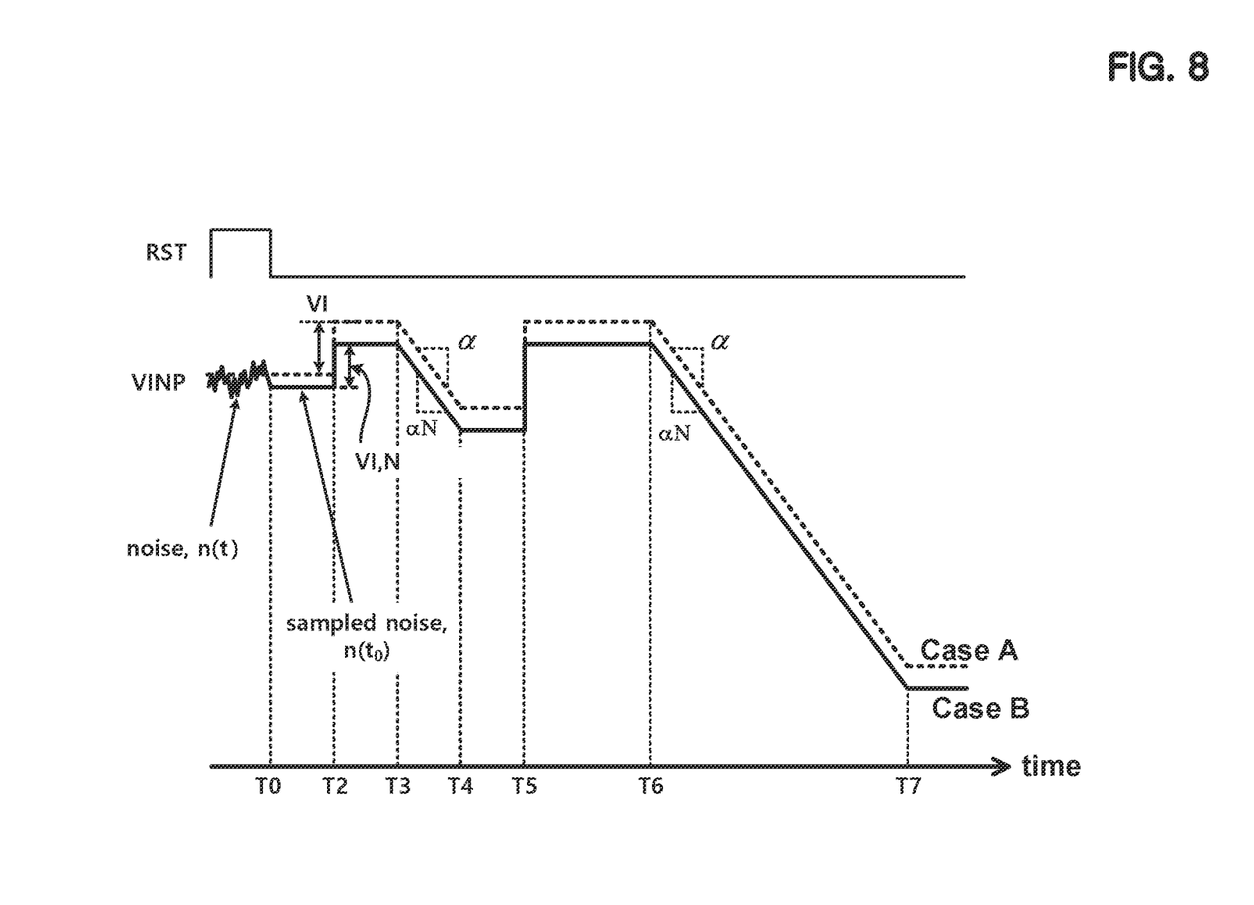
FIG. 8 shows a timing diagram illustrating a bias sampling operation according to an embodiment of the present disclosure.

FIG. 8 shows a timing diagram illustrating a bias sampling operation according to an embodiment of the present disclosure.

"Case A" indicates a state in which there is no noise, and "Case B" indicates a state in which there exist noise.

When noise is generated in the current source, noise is added to the initial voltage VI as described above, and noise is also added to the decrease rate a of the ramp signal provided as the first input voltage VINP.

When the noise changes with time, it becomes difficult to measure an accurate value because the initial voltage VI is different in the primary operation and in the secondary operation.

In addition, when the decrease rate a is changed, the ramp signal VINP changes non-linearly, making it difficult to measure an accurate value as well.

In the present disclosure, the voltage charged in the bias sampling capacitor 614 is determined at time T0 when the reset signal is activated and then deactivated.

Accordingly, the noise does not change with time and is fixed to the noise at the time, so that an accurate value can be measured through the primary operation and the secondary operation.

In FIG. 8, the initial voltage based on the fixed noise is denoted by VI,N, and the decrease rate of the ramp signal VINP is denoted by αN.

Accordingly, Equation 5 may be changed to Equation 6.

$$DO = VSIG \times \frac{Fosc}{\alpha N} \quad \text{[Equation 6]}$$

By comparing the digital value DO of Equation 6 with two threshold values, it may be determined whether the distance to the object is within a predetermined range.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A semiconductor device comprising:
   a bias generating circuit configured to sample a bias voltage according to a reset signal; and
   a current source configured to provide a bias current according to the bias voltage,
   wherein the bias generating circuit includes:
   a PMOS transistor having a gate and a drain coupled in common; and
   a bias sampling capacitor; and
   a switch configured to couple a gate of the PMOS transistor and the bias sampling capacitor according to the reset signal.

2. A semiconductor device comprising:
   a signal conversion circuit configured to convert a sensing current provided from a sensing element into a sensing voltage;
   an analog-to-digital converter (ADC) configured to convert the sensing voltage to a digital value; and a driving circuit configured to drive a light emitting element, wherein the ADC generates a digital value corresponding to proximity to an object by performing a primary operation comparing a ramp signal varying with time and the sensing voltage while the light emitting element is not driven and a secondary operation comparing the ramp signal and the sensing voltage while the light emitting element is driven, wherein the ADC includes:

a ramp signal generating device configured to generate the ramp signal;

a comparator configured to compare the ramp signal and the sensing voltage;

a counter configured to count a clock signal during the primary operation and the secondary operation;

a first latch configured to store counter value of the counter in the primary operation;

a second latch configured to store counter value of the counter in the secondary operation; and a signal processing circuit configured to generate the digital value according to outputs from the first latch and the second latch, and, wherein the ramp signal generating device includes:

a bias generating circuit;

a current control circuit having a current source whose current is adjusted according to the bias generating circuit and generating an output current whose value is increasing or decreasing by a predetermined amount according to time; and an output resistor generating a ramp signal at an output node corresponding to the output current.

3. The semiconductor device of claim 2, wherein the signal conversion circuit includes:

an operational amplifier;

a bias circuit providing a bias voltage to a positive input terminal of the operational amplifier; and a feedback resistor coupled between a negative input terminal of the operational amplifier where the sensing current is provided and an output terminal of the operational amplifier.

4. The semiconductor device of claim 2, wherein the current control circuit includes a first current control circuit having a plurality of first unit current control circuits, wherein each of the plurality of first unit current control circuits provides a first unit current as the output current, and the first current control circuit adjusts the output current by the first unit current.

5. The semiconductor device of claim 4, wherein the current control circuit includes a second current control circuit having a plurality of second unit current control circuits, wherein each of the plurality of second unit current control circuits provides a second unit current as the output current, and the second current control circuit adjusts the output current by the second unit current.

6. The semiconductor device of claim 5, wherein the first current control circuit and the second current control circuit provides respective maximum current at initial stages of the primary operation and the secondary operation.

7. The semiconductor device of claim 6, wherein the current control circuit further includes an initial current circuit configured to provide an initial current at the initial stages of the primary operation and the secondary operation as the output current.

8. The semiconductor device of claim 4, wherein the first unit current control circuit includes a current source controlled by a bias voltage, wherein the bias generating circuit provides a predetermined voltage as the bias voltage during a reset operation performed before the primary operation and the secondary operation.

9. The semiconductor device of claim 8, wherein the bias generating circuit includes a bias sampling capacitor storing the bias voltage during the reset operation.

10. The semiconductor device of claim 2, wherein the current control circuit further generates a second output current varying in opposite direction to the output current with time, wherein the ramp signal generating circuit further includes a second output resistor generating a second output voltage corresponding to the second output current at a second output node.

11. The semiconductor device of claim 10, wherein the ramp signal generating circuit further includes a capacitor coupled in parallel to the output resistor.

12. The semiconductor device of claim 10, wherein the ramp signal generating circuit further includes a unit gain amplifier coupled between the output node and the second output node.

13. The semiconductor device of claim 2, wherein the ADC further includes a coupling capacitor providing the ramp signal and the sensing voltage to the comparator.

14. The semiconductor device of claim 13, wherein the comparator is a differential amplifier including a positive input terminal and a negative input terminal, and performs an auto-zero operation before the primary operation and the secondary operation where the positive input terminal and the negative input terminal are commonly coupled to a common mode voltage.

* * * * *